United States Patent [19]

Nakao

[11] Patent Number: 5,366,794
[45] Date of Patent: Nov. 22, 1994

[54] TAPE CARRIER FOR SEMICONDUCTOR APPARATUS

[75] Inventor: Shin Nakao, Itami, Japan

[73] Assignee: Mitsubishi Denki Kabushiki Kaisha, Tokyo, Japan

[21] Appl. No.: 834,818

[22] Filed: Feb. 13, 1992

[30] Foreign Application Priority Data

Jul. 30, 1991 [JP] Japan .................. 3-189863

[51] Int. Cl.$^5$ ................................. B32B 9/00
[52] U.S. Cl. ...................... 428/209; 257/666
[58] Field of Search ........... 428/210, 209; 257/666; 206/330; 357/68, 70

[56] References Cited

U.S. PATENT DOCUMENTS

| | | | |
|---|---|---|---|
| 3,404,319 | 10/1968 | Tsuji et al. | 257/666 |
| 3,628,105 | 12/1971 | Sakai | 257/664 |
| 4,575,748 | 3/1986 | Terui et al. | 257/666 |
| 4,903,114 | 2/1990 | Aoki et al. | 357/70 |
| 4,953,005 | 8/1990 | Carlson et al. | 257/666 |
| 4,961,984 | 10/1990 | Takeda | 206/330 |
| 4,982,268 | 1/1991 | Schuermann | 257/666 |
| 5,118,556 | 6/1992 | Makino et al. | 206/330 |
| 5,196,917 | 3/1993 | Ueda et al. | 257/666 |

FOREIGN PATENT DOCUMENTS

| | | |
|---|---|---|
| 0333132 | 3/1989 | European Pat. Off. . |
| 0380906 | 1/1990 | European Pat. Off. . |
| 0380906 | 8/1990 | European Pat. Off. . |
| 5021866 | 6/1991 | Japan ................. 357/70 |

OTHER PUBLICATIONS

"Patent Abstracts of Japan", E-756, May 11, 1989, vol. 13, No. 198.
"Patent Abstracts of Japan", E-1075, Jun. 7, 1991, vol. 15, No. 223.
"Technique to Fabricate Co-Planar Conductors in a Dielectric Layer", IBM Technical Disclosure Bulletin, vol. 33, Jul. 1990, pp. 258-259.
"Mit Sacklöchern und, vergrabenen 'Bohrungen den Multilayer optimieren," Productronic 5-1991, S. 102.
"Advanced TAB Circuits", a catalogue for TAB tape by Rogers Co., Ltd, 1990.
"Two Layer TAB Tape", 3M.

Primary Examiner—Patrick J. Ryan
Assistant Examiner—Kam F. Lee
Attorney, Agent, or Firm—Leydig, Voit & Mayer

[57] ABSTRACT

A tape carrier for semiconductor apparatus and a method of manufacturing the tape carrier includes three or more layers and contact holes of small size. A peelable agent is applied to a planar substrate made of glass or the like, and plural insulating layers and plural conductive layers are alternatingly formed thereon in predetermined patterns. The peelable agent is then removed to peel the tape carrier from the substrate. The tape carrier includes the insulating layers and the conductive layers and has projection electrodes but no tape base.

4 Claims, 9 Drawing Sheets

TAPE CARRIER FOR SEMICONDUCTOR APPARATUS

BACKGROUND OF THE INVENTION

1. Field of the Invention

This invention relates to a tape carrier and a method of manufacturing the tape carrier for use with semiconductor apparatus, and more particularly to a tape carrier for the TAB (Tape Automated Bonding) technique and a method of manufacturing the tape carrier.

2. Related Prior Art

Figure 11:
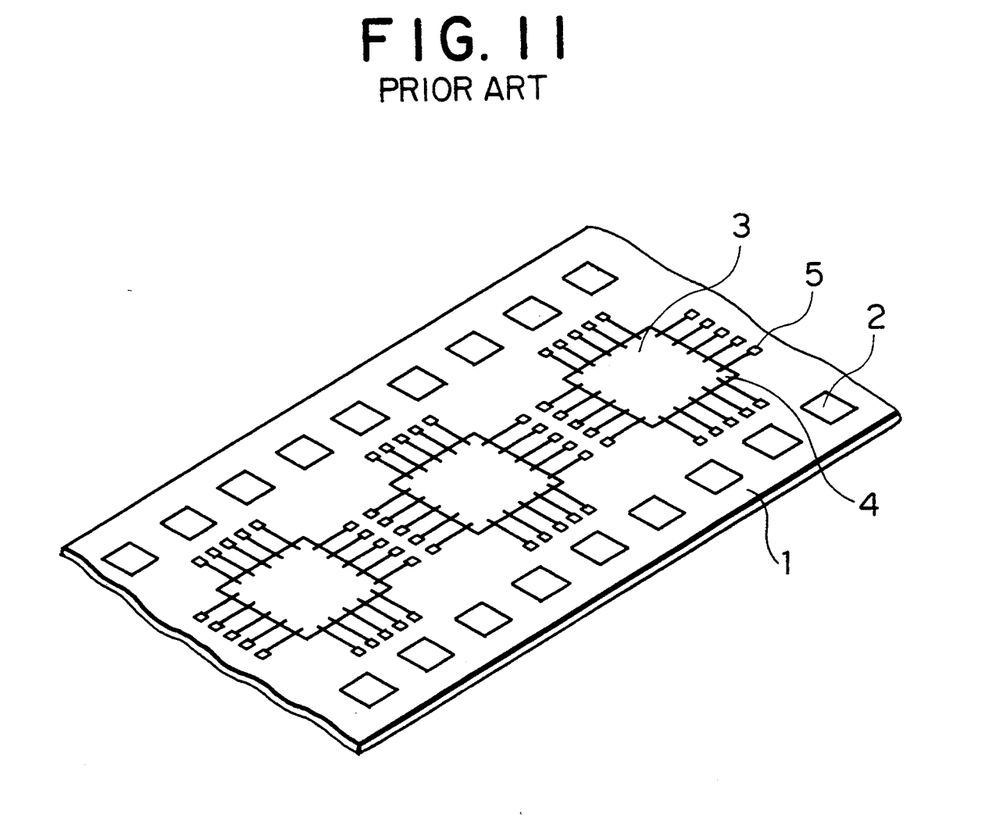
FIG. 11 is a perspective view showing a conventional tape carrier.
Figure 12:
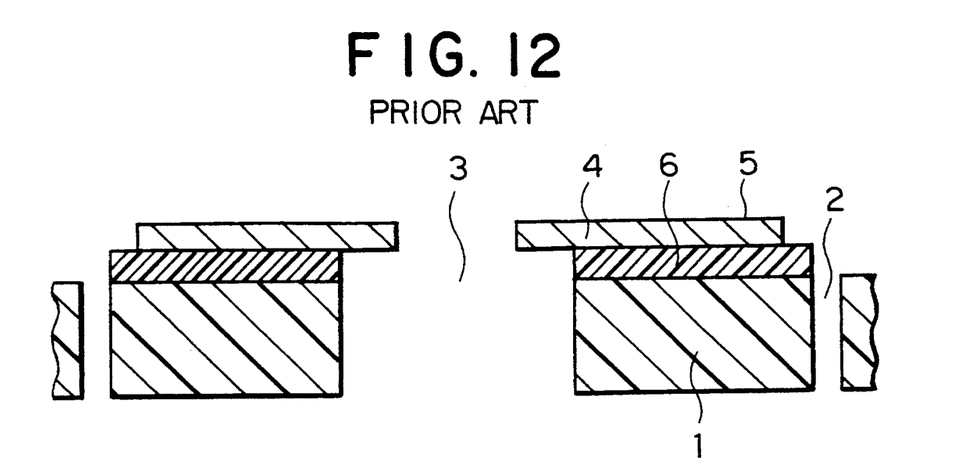
FIG. 12 is a cross-sectional view of the tape carrier shown in FIG. 11.
Figure 13:
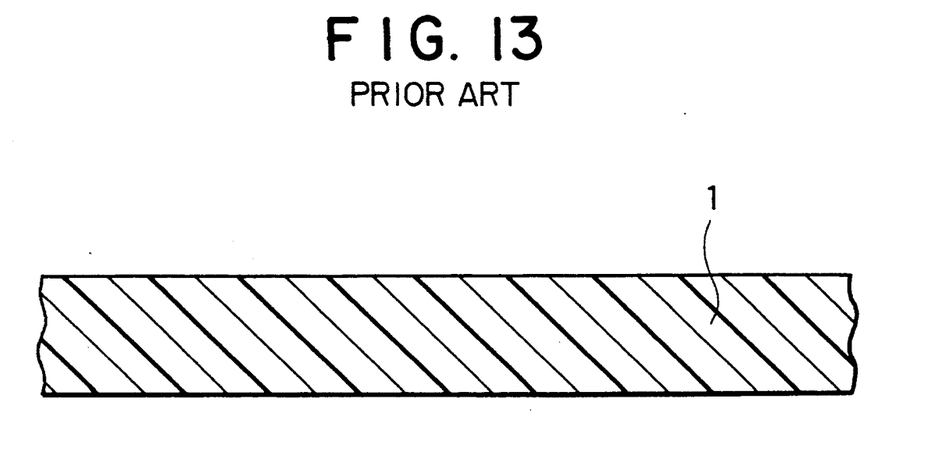
FIG. 13 is a cross-sectional view of a tape base used in manufacturing the tape carrier shown in FIG. 12.

FIG. 11 is a perspective view showing a conventional tape carrier for semiconductor apparatus and FIG. 12 is a cross-sectional view of FIG. 11. In these drawings, a tape base 1 of the tape carrier is formed of, for example, polyimide resin with a thickness on the order of 75 $\mu$m to 125 $\mu$m. The tape base 1 has formed therein device holes 3 in the form of openings where semiconductor elements (not shown) are placed, and perforations 2 as positioning holes used to transport the tape carrier. Inner leads (and wirings) 4 to be connected with electrodes of the semiconductor element have one end projecting into each of the device holes 3 and another end connected to test electrodes 5 used for testing the semiconductor element. The inner leads 4 and the test electrodes 5 are formed of a material such as Cu and bonded to the tape base 1 by an adhesive 6, with Sn, Ni/Au or the like plated on their surfaces.

Figure 14:
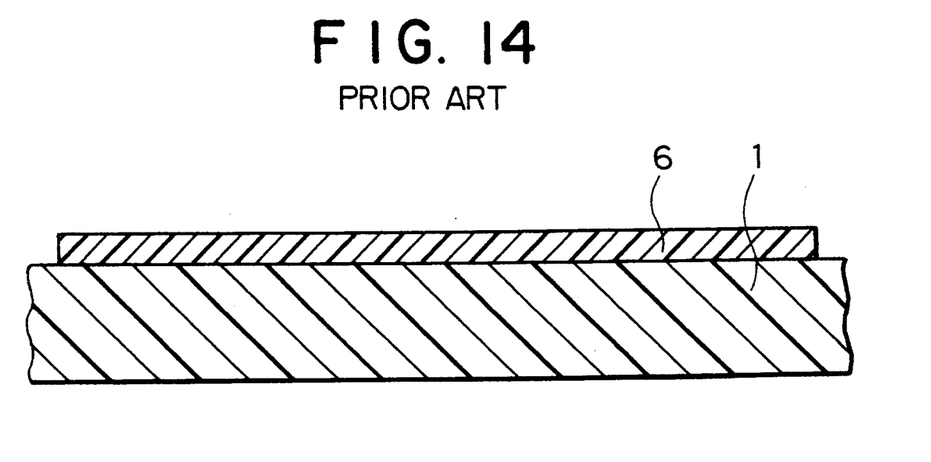
FIG. 14 is a cross-sectional view showing an adhesive applied to the tape base of FIG. 13.
Figure 15:
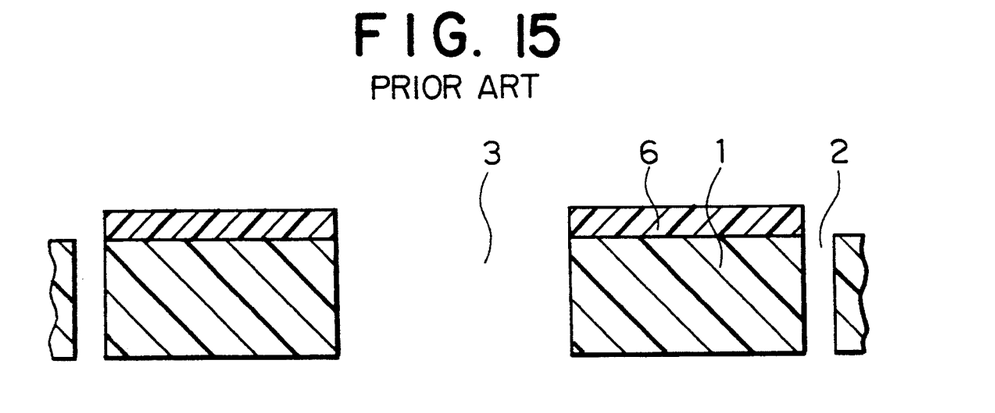
FIG. 15 is a cross-sectional view showing perforations and a device hole in the tape base of FIG. 14.
Figure 16:
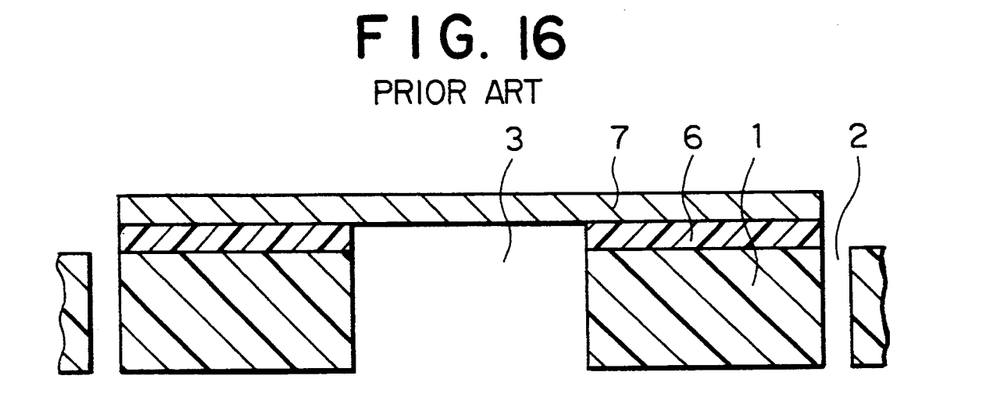
FIG. 16 is a cross-sectional view showing a metal foil on the tape base of FIG. 15.

Conventional tape carriers are constructed as stated above, and the tape carrier shown in FIGS. 11 and 12 is manufactured through the steps shown in FIGS. 13 to 16. First, an adhesive 6 is applied to the tape base 1 shown in FIG. 13, as shown in FIG. 14. Next, the device holes 3 and the perforations 2 are cut as shown in FIG. 15 by punching using dies or the like. Then, a metal foil 7 made of Cu or the like is pasted in place as shown in FIG. 16, following which the metal foil 7 is subjected to photoengraving, etching, etc. to form the inner leads 4 and the test electrodes 5 as shown in FIG. 12. Finally, Sn, Ni/Au or the like is plated on the surfaces of the inner leads 4, thereby completing manufacture of the tape carrier.

Figure 17:
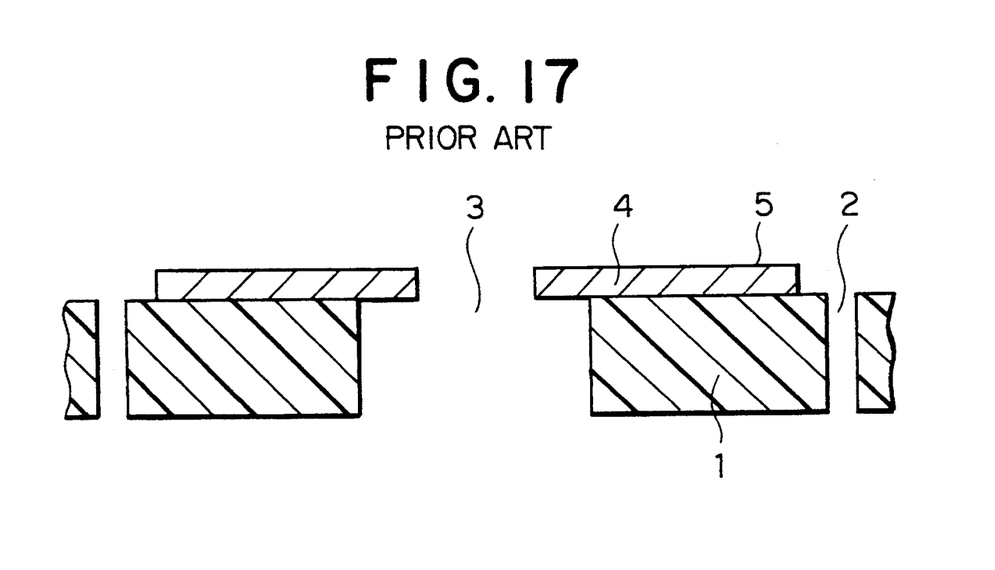
FIG. 17 is a cross-sectional view showing inner leads and test electrodes formed from the metal foil of FIG. 16 on the tape base.
Figure 18:
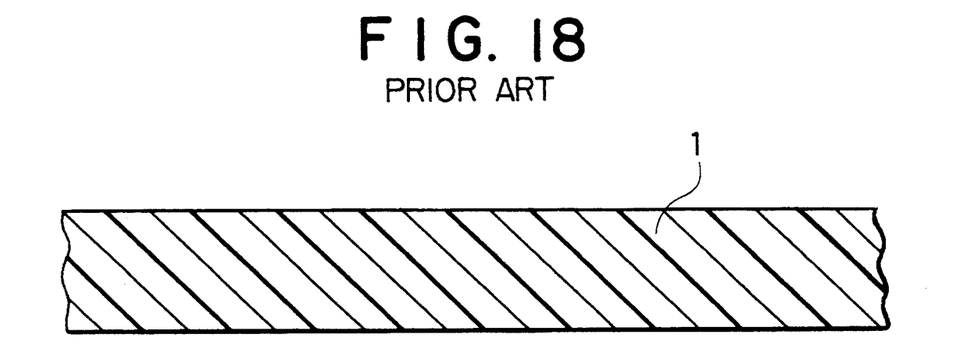
FIG. 18 is a cross-sectional view showing a tape base used in manufacturing another conventional tape carrier.
Figure 19:
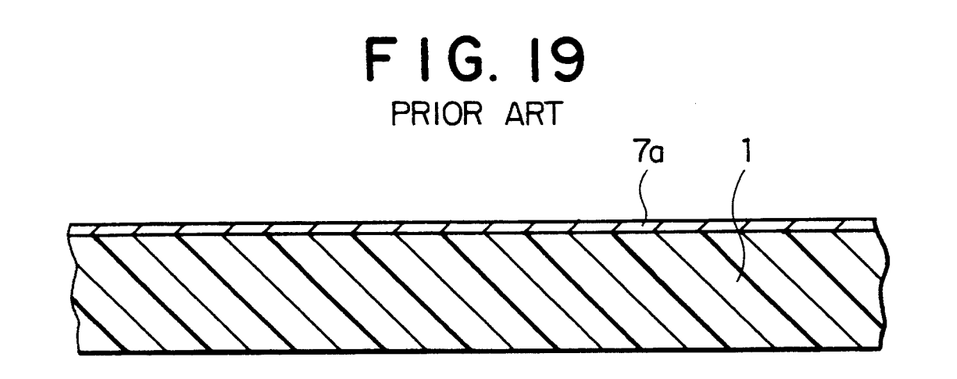
FIG. 19 is a cross-sectional view showing a metal thin film on the tape base of FIG. 18.
Figure 20:
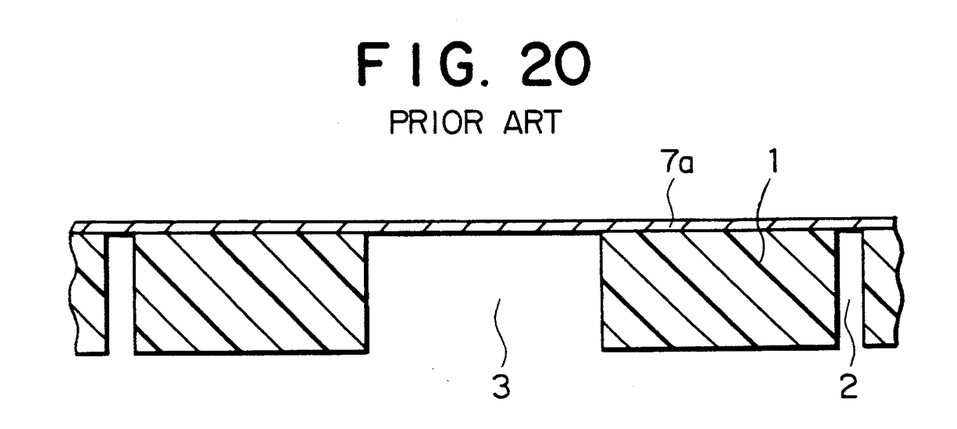
FIG. 20 is a cross-sectional view showing perforations and a device hole in the tape base of FIG. 19.
Figure 21:
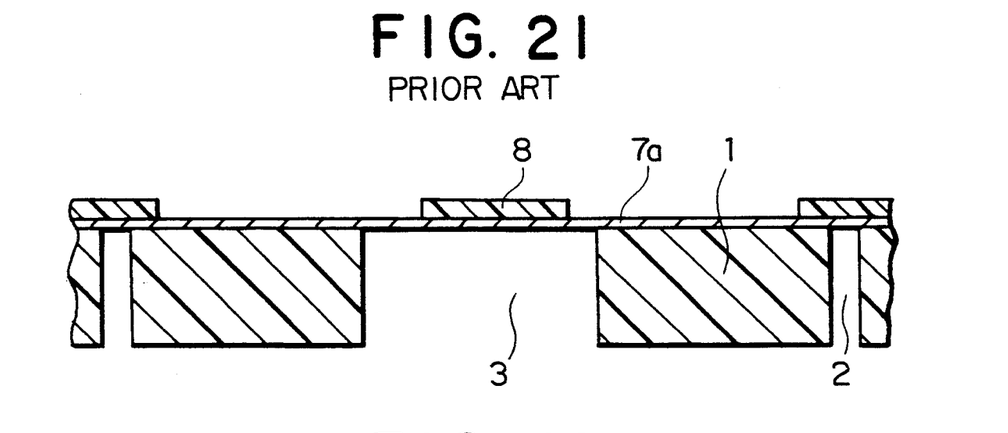
FIG. 21 is a cross-sectional view showing resist patterns on the metal thin film on the tape base of FIG. 20.
Figure 22:
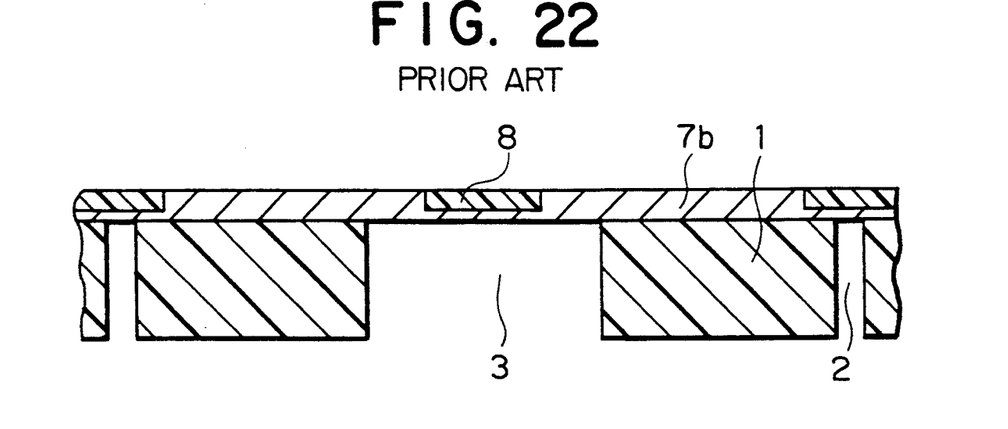
FIG. 22 is a cross-sectional view showing a metal thin film on the tape base of FIG. 21.
Figure 23:
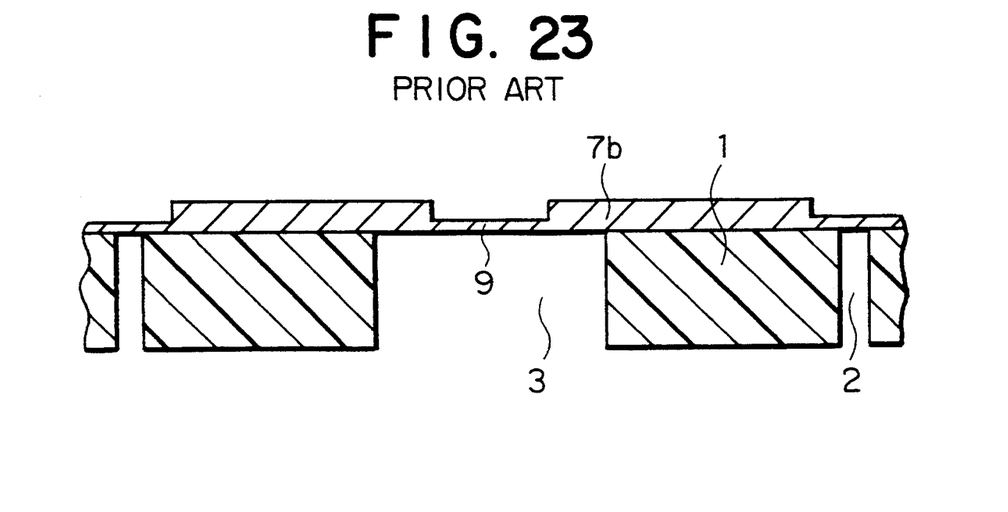
FIG. 23 is a cross-sectional view showing the resist patterns on the tape base of FIG. 22 removed.

Another tape carrier shown in FIG. 17 basically has the same construction as that shown in FIG. 12 except that, in the tape carrier of FIG. 17, the inner leads 4 are directly attached to the tape base 1 without using the adhesive 6. A method of manufacturing the tape carrier shown in FIG. 17 will be explained with reference to FIGS. 18 to 23. First, a metal thin film 7a of Cu or the like is formed by sputtering on the tape base 1 of FIG. 18, as shown in FIG. 19. Next, the device holes 3 and the perforations 2 are formed as shown in FIG. 20 by photoengraving, etching, etc. Subsequently, as shown in FIG. 21, a photoresist pattern 8 is formed at locations other than those where the inner leads 4 are to be provided, following which a metal thin film 7b of Cu or the like is disposed to a thickness on the order of 20 $\mu$m to 30 $\mu$m by a process such as electrolytic plating as shown in FIG. 22. Then, the photoresist pattern 8 is removed as shown in FIG. 23 and extra thin film portions 9 are etched away to produce the tape carrier shown in FIG. 17. Finally, Sn, Ni/Au or the like is plated on the surfaces of the inner leads 4, thereby completing manufacture of the tape carrier.

In the above tape carriers, with an increase in the number of pins and the processing speeds of semiconductor elements, there has not only become stronger a demand for a reduction in the component size of the tape carriers, but also a demand for increasing the number of layers of the tape carriers in order to reduce the inductance of the wiring. Because of the foregoing construction, however, the conventional tape carriers have difficulties meeting these demands.

More specifically, in the case of the tape carrier shown in FIG. 12, since holes cannot be formed in the tape base 1 by etching, it is not possible to form openings having dimensions less than 100 $\mu$m$\phi$. As regards to the multi-layer structure, a two-layer tape carrier can be manufactured by forming conductor patterns on the rear side of the tape base 1, but tape carriers having three or more layers have been difficult to manufacture. Further, metal foils of Cu or the like as thick as 20 $\mu$m to 30 $\mu$m must be etched, which leads to difficulties in etching those metal foils with a line width of 20 $\mu$m to 30 $\mu$m, for example, and hence a problem in reducing the pattern size.

In the case of the tape carrier shown in FIG. 17, there has been a problem that with patterns of small size, adhesion between the photoresist and the underlying metal layer is poor and the underlying metal layer tends to peel off. Particularly, if the underlying metal layer is as thin as 50 $\mu$m to 75 $\mu$m and hence weak in mechanical strength, the underlying metal layer may peel off while being transported for the purpose of etching the tape base 1. Further, although the two-layer structure is feasible from the viewpoint of practical construction, there have similarly been difficulties in realizing three or more layers because the tape base is too thick to form openings small in size.

SUMMARY OF THE INVENTION

This invention has been made to solve the problems mentioned above, and has for its object to provide a tape carrier for a semiconductor apparatus and a method of manufacturing the tape carrier, with small patterns with a line width less than 20 $\mu$m to 30 $\mu$m, for example, and a line spacing less than 10 $\mu$m to 20 $\mu$m, for example, and with openings smaller than 10 $\mu$m to 20 $\mu$m, for example, in an insulating layer, while including three or more conductive layers.

To achieve the above object, in accordance with one aspect of this invention, there is provided a tape carrier for semiconductor apparatus comprising a plurality of conductive layers formed in predetermined patterns, a plurality of insulating layers formed in predetermined patterns and laminated alternatingly with said conductive layers, test electrodes electrically connected with said conductive layer by a conductor pattern, connecting portions electrically connected to said conductive layer by a conductor pattern and also connectable to respective electrodes of a semiconductor element, and an opening in which a semiconductor element is to be placed.

In accordance with another aspect of this invention, there is provided a method of manufacturing a tape carrier for a semiconductor apparatus comprising the steps of applying a peelable agent to a flat substrate, repeatedly forming alternating insulating layers and conductive layers in predetermined patterns on said peelable agent by a process such as photoengraving or etching, to thereby form a tape carrier including openings in which semiconductor elements are to be placed, test electrodes used for testing said semiconductor elements, and connecting portions to be connected with electrodes of said semiconductor elements, and peeling said tape carrier from said substrate.

DETAILED DESCRIPTION OF PREFERRED EMBODIMENT

Figure 1:
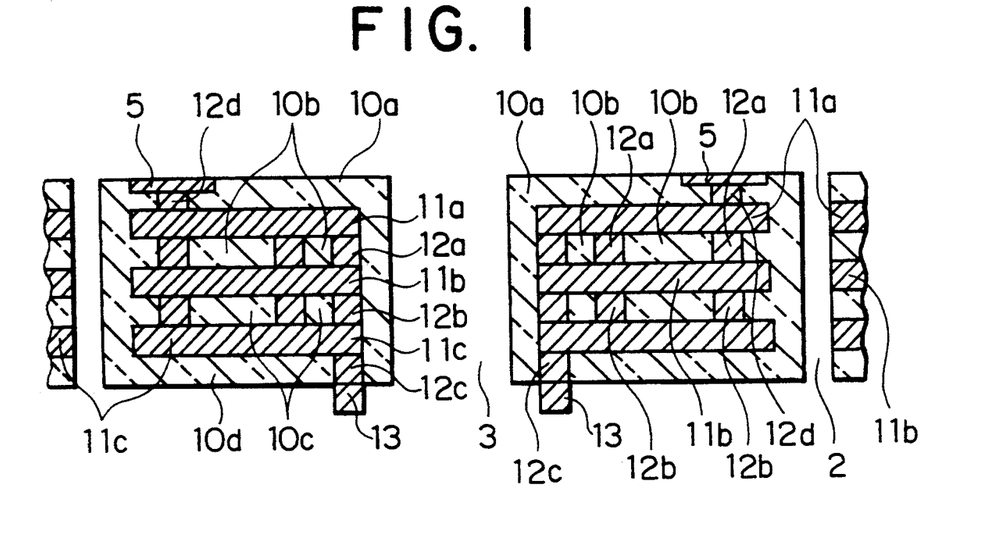
FIG. 1 is a cross-sectional view of a tape carrier according to one embodiment of this invention.

FIG. 1 is a cross-sectional view showing a tape carrier according to one embodiment of this invention. In each drawing referred to hereinafter, the same reference numerals denote the same or identical parts. In FIG. 1, the tape carrier includes connecting portions, e.g., projecting electrodes 13, extending beyond, i.e., projecting from the insulating layer 10a for connection to electrodes of a semiconductor element (not shown), and three conductive layers 11a to 11c all connected to the projection electrodes 13. Four insulating layer 10a–10d include contact holes 12a to 12c for electrically interconnecting the conductive layers 11a to 11c. The insulating layers 10a to 10d electrically separate the conductive layers 11a to 11c from one another. Test electrodes 5 are electrically connected to the conductive layer 11a via a contact hole 12d. Note that although the contact holes 12a to 12d each have a conductive material (conductor pattern) therein, the contact holes including such conductive layers are simply referred to as the contact holes 12a to 12d here.

As with the conventional tape carriers, this tape carrier has a device hole 3 where a semiconductor element is to be placed, and perforations 2 as positioning holes used to transport the tape carrier.

Figure 2:
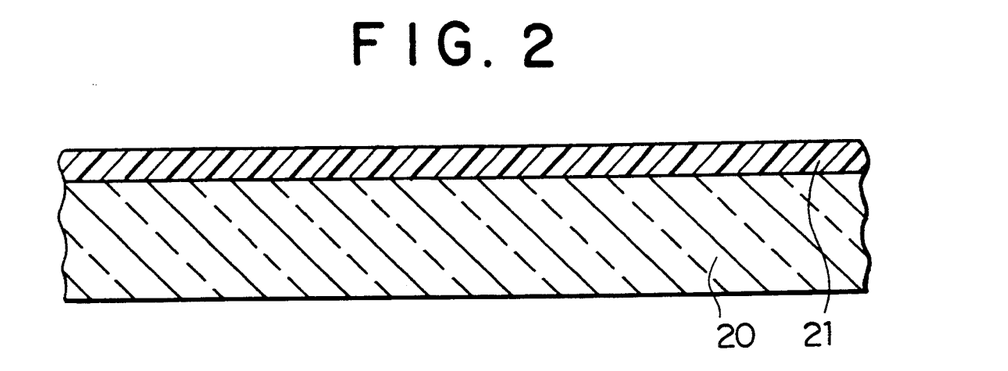
FIG. 2 is a cross-sectional view of a flat substrate used in manufacturing the tape carrier of FIG. 1.

The tape carrier of the above construction is manufactured through the steps shown in FIGS. 2 to 10. First, as shown in FIG. 2, a peelable agent 21 is applied all over the surface of a transparent and planar substrate 20 made of glass or the like. The peelable agent 21 may be a photoresist film or an organic (thin) film, for example, and can be removed in a later step by a peeling solution, solvent, etc.

Figure 3:
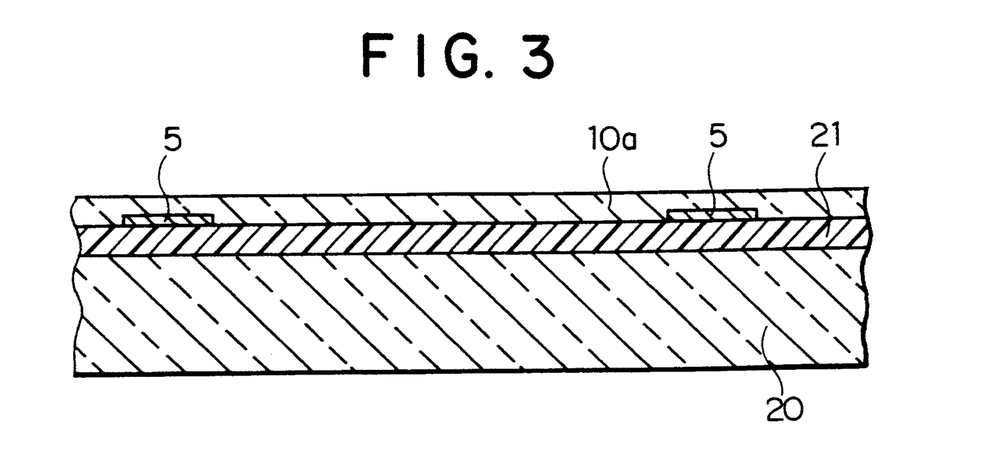
FIG. 3 is a cross-sectional view showing test electrodes and an insulating layer on the flat substrate of FIG. 2.
Figure 4:
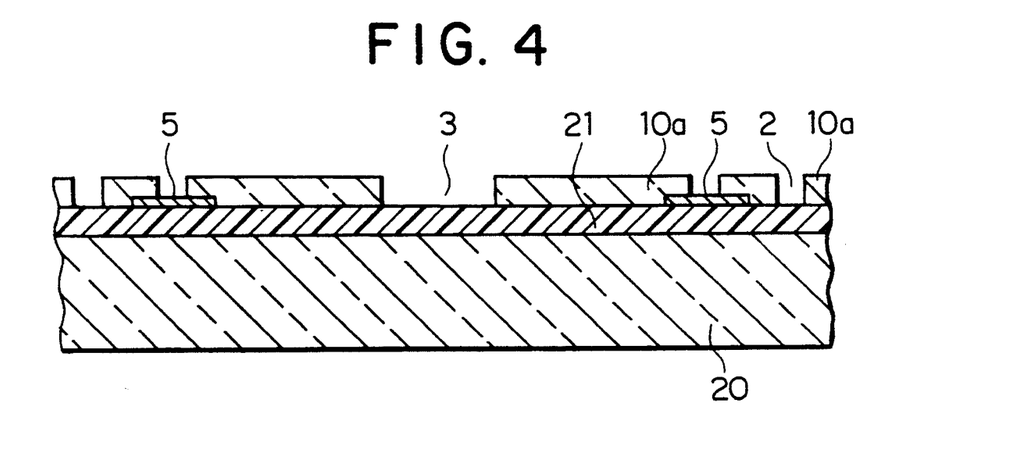
FIG. 4 is a cross-sectional view showing perforations and a device hole in the flat substrate of FIG. 3.
Figure 5:
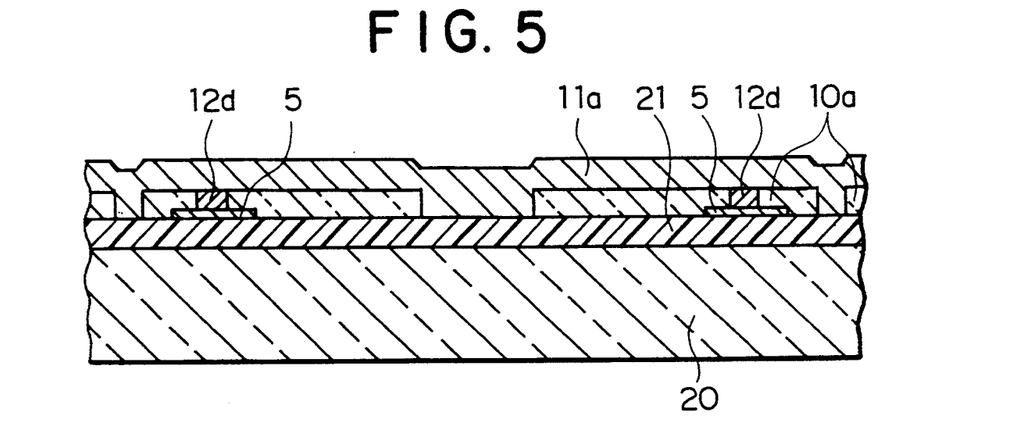
FIG. 5 is a cross-sectional view showing a conductive layer on the flat substrate of FIG. 4.
Figure 6:
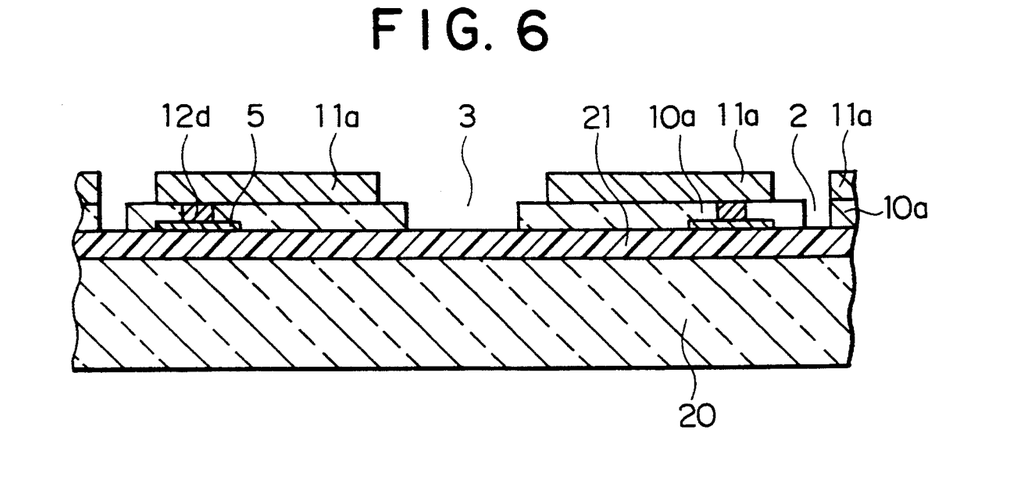
FIG. 6 is a cross-sectional view showing the conductive layer of FIG. 5 on the flat plate-like substrate removed from predetermined areas.
Figure 7:
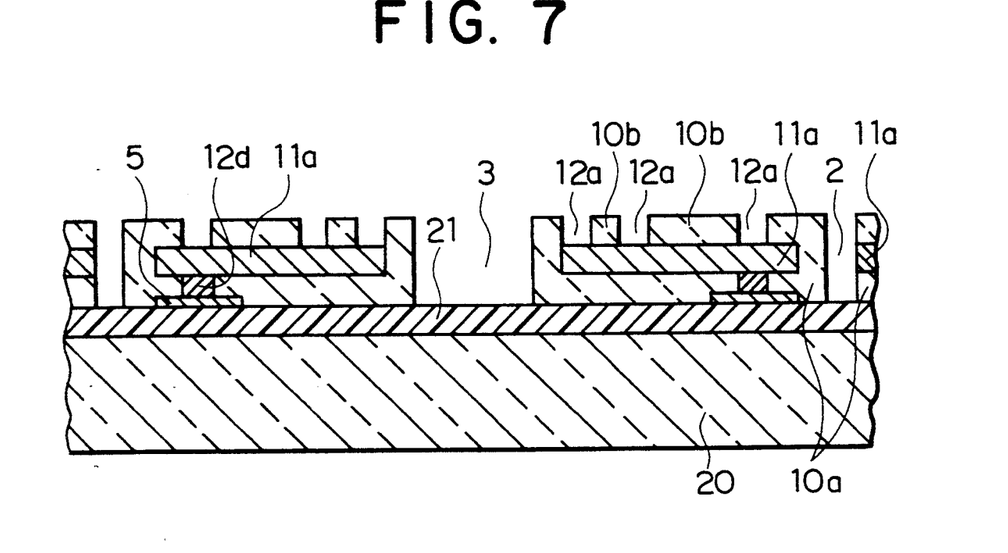
FIG. 7 is a cross-sectional view showing an insulating layer on the flat substrate of FIG. 6.

Next, as shown in FIG. 3, a conductive layer for the test electrodes 5 is formed on the peelable agent 21. After applying the first insulating layer 10a formed of polyimide or the like, the perforations 2 and the device hole 3 are formed by photoengraving as shown in FIG. 4. Then, as shown in FIG. 5, a first conductive layer 11a is formed thereon. Subsequently, as shown in FIG. 6, the first conductive layer 11a is patterned by photoetching and then, as shown in FIG. 7, the second insulating layer 10b is patterned to form the first contact holes 12a.

Figure 8:
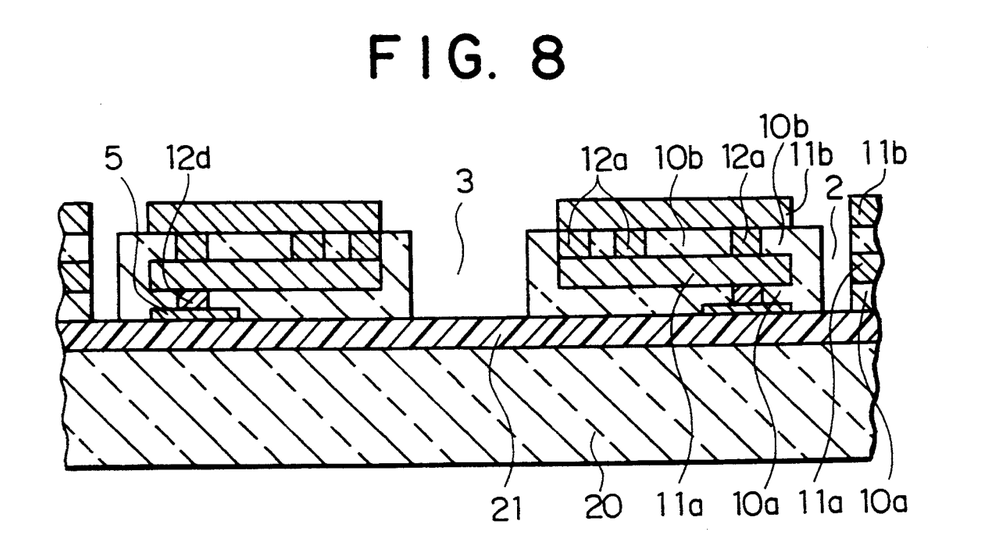
FIG. 8 is a cross-sectional view showing a conductive layer on the flat substrate of FIG. 7.
Figure 9:
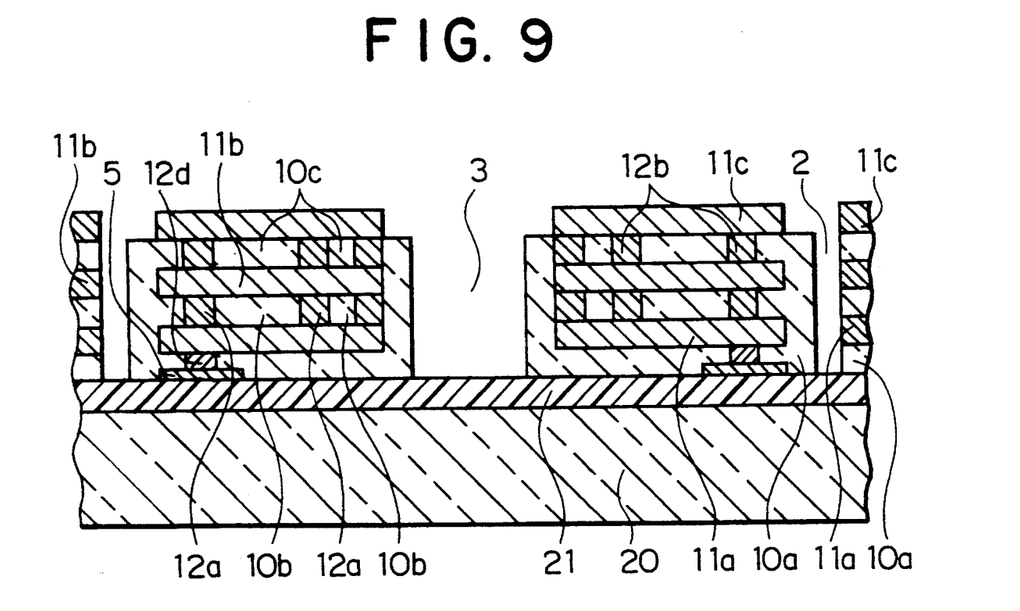
FIG. 9 is a cross-sectional view showing a conductive layer on the flat substrate of FIG. 8.
Figure 10:
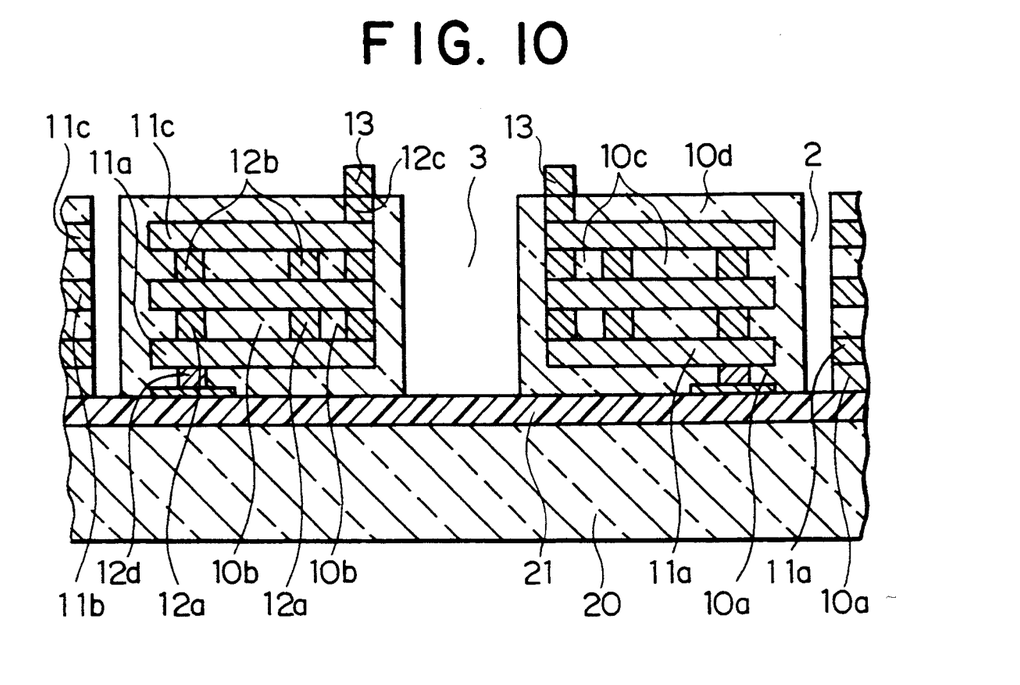
FIG. 10 is a cross-sectional view showing an insulating layer on the flat substrate of FIG. 9.

By repeating the steps similar to the above, the second and third conductive layers 11b, 11c, the second and third insulating layers 10b, 10c, as well as the second contact hole 12b are formed as shown in FIGS. 8 and 9. Thereafter, the fourth insulating layer 10d, the third contact holes 12c and the projecting electrodes 13 are formed in a like manner. Finally, ultraviolet light irradiates the transparent and flat plate-like substrate 20 from the rear side, so that the peelable agent 21 is removed to peel the tape carrier from the flat plate-like substrate 20, thereby producing the tape carrier shown in FIG. 1.

In the above manufacture method, the total film thickness of the tape carrier can be controlled to on the order of 75 to 125 μm by providing the conductive layers in the form of coarse pattern (wide width) layers to control the thickness of each conductive layer. Accordingly, after completion of the tape carrier, it can be handled like the prior art carrier without impairing flexibility, a feature of the conventional tape carriers. The projecting electrodes 13 allows connection to electrodes of a semiconductor element with leads at a smaller pitch. Further, the opening of the insulating layers can be reduced to less than 10 μmφ.

Although the foregoing embodiment is described in connection with the case of a tape carrier having three conductive layers, this invention makes it possible to form four or more conductive layers by repeating the steps of laminating the layers. Also, while the electrical connecting portions for connection to a semiconductor element are the projecting electrodes 13 in the foregoing embodiment, they may be in the form of leads such as inner leads like the prior art. Furthermore, although the foregoing embodiment is explained as peeling from the transparent and flat plate-like substrate 20 after irradiation with ultraviolet light, the substrate 20 may be removed using a solvent, etc. In this case, it is not required to use a transparent substrate.

With this invention constructed as stated above, there numerous advantages are achieved.

Since small patterns can be formed in the tape carrier for semiconductor apparatus according to this invention, it is possible to adapt for a reduction in the electrode pitch of semiconductor elements and to provide a structure having three or more conductive layers. The insulating layer can be also reduced in thickness for making the contact holes smaller.

Further, with the method of manufacturing the tape carrier according to this invention, the total film thickness of the tape carrier after being removed from the substrate can be controlled by adjusting the thickness of each conductive layer, and the tape carrier can be handled like conventional ones. In addition, since the projecting electrodes can be easily made very small size on the tape carrier, it is also possible to connect the projecting electrodes with corresponding electrodes of a semiconductor element.

What is claimed is:

1. A tape carrier for a semiconductor element comprising an electrically insulating tape including opposed first and second surfaces, an opening for receiving a semiconductor element, a plurality of generally parallel electrically conducting films embedded in the electrically insulating tape, electrical conductors embedded in the electrically insulating tape transverse to the electrically conducting films selectively electrically interconnecting the electrically conducting films, a projecting electrode projecting from the first surface of the electrically insulating tape and electrically connected to at least one of the electrically conducting films by one of the electrical conductors, and a test electrode flush with the second surface of the electrically insulating tape and electrically connected to at least one of the electrically conducting films by one of the electrical conductors.

2. The tape carrier of claim 1 wherein the electrically insulating tape is polyimide.

3. The tape carrier of claim 2 wherein the electrically insulating polyimide tape is 75 to 125 microns thick.

4. The tape carrier of claim 1 wherein the electrically conducting films are arranged in predetermined patterns within the electrically insulating tape.

* * * * *